(12) United States Patent
Goldman et al.

(10) Patent No.: US 9,001,577 B2
(45) Date of Patent: Apr. 7, 2015

(54) MEMORY CELL SENSING

(75) Inventors: Matthew Goldman, Folsom, CA (US); Pranav Kalavade, San Jose, CA (US); Uday Chandrasekhar, San Jose, CA (US); Mark A. Helm, Santa Cruz, CA (US)

(73) Assignee: Micron Technology, Inc., Boise, ID (US)

( * ) Notice: Subject to any disclaimer, the term of this patent is extended or adjusted under 35 U.S.C. 154(b) by 313 days.

(21) Appl. No.: 13/486,767

(22) Filed: Jun. 1, 2012

(65) Prior Publication Data
US 2013/0322170 A1 Dec. 5, 2013

(51) Int. Cl.
| G11C 11/34 | (2006.01) |
| G11C 16/04 | (2006.01) |
| G11C 16/26 | (2006.01) |
| G11C 16/28 | (2006.01) |
| G11C 16/34 | (2006.01) |

(52) U.S. Cl.
CPC .............. *G11C 16/26* (2013.01); *G11C 16/28* (2013.01); *G11C 16/3427* (2013.01)

(58) Field of Classification Search
USPC ............. 365/185.03, 185.09, 185.17, 185.18, 365/185.21, 205, 207
See application file for complete search history.

(56) References Cited

U.S. PATENT DOCUMENTS

| 5,867,429 | A | 2/1999 | Chen et al. |
| 6,731,542 | B1 | 5/2004 | Le et al. |
| 6,768,679 | B1 | 7/2004 | Le et al. |
| 6,956,770 | B2 | 10/2005 | Khalid et al. |
| 6,965,648 | B1 | 11/2005 | Smith et al. |
| 6,987,693 | B2 | 1/2006 | Cernea et al. |
| 7,020,017 | B2 | 3/2006 | Chen et al. |
| 7,187,585 | B2 | 3/2007 | Li et al. |
| 7,196,928 | B2 | 3/2007 | Chen |
| 7,400,532 | B2 | 7/2008 | Aritome |
| 7,535,769 | B2 * | 5/2009 | Cernea ..................... 365/185.22 |
| 7,602,647 | B2 | 10/2009 | Li et al. |
| 7,898,864 | B2 | 3/2011 | Dong |
| 2006/0291282 | A1 | 12/2006 | Liu et al. |
| 2007/0103986 | A1 | 5/2007 | Chen |
| 2007/0195602 | A1 | 8/2007 | Fong et al. |
| 2009/0154238 | A1 | 6/2009 | Lee |
| 2010/0067296 | A1 | 3/2010 | Li |
| 2010/0091582 | A1 | 4/2010 | Vali et al. |
| 2010/0157676 | A1 * | 6/2010 | Isobe ....................... 365/185.11 |

(Continued)

OTHER PUBLICATIONS

International Search Report and Written Opinion for related PCT Application No. PCT/US2013/043702, mailed Sep. 26, 2013, (11 pgs.).

(Continued)

*Primary Examiner* — Thao H Bui
(74) *Attorney, Agent, or Firm* — Brooks, Cameron & Huebsch, PLLC

(57) ABSTRACT

This disclosure concerns memory cell sensing. One or more methods include determining a data state of a first memory cell coupled to a first data line, determining a data state of a third memory cell coupled to a third data line, transferring determined data of at least one of the first and the third memory cells to a data line control unit corresponding to a second data line to which a second memory cell is coupled, the second data line being adjacent to the first data line and the third data line, and determining a data state of the second memory cell based, at least partially, on the transferred determined data.

39 Claims, 4 Drawing Sheets

(56) References Cited

U.S. PATENT DOCUMENTS

| | | |
|---|---|---|
| 2011/0051523 A1 | 3/2011 | Manabe et al. |
| 2011/0063919 A1 | 3/2011 | Chandrasekhar et al. |
| 2011/0103151 A1 | 5/2011 | Kim et al. |
| 2011/0122695 A1 | 5/2011 | Li et al. |

OTHER PUBLICATIONS

Kavalipurapu, et al., Memory Cell Sensing, Filed Nov. 1, 2011 as U.S. Appl. No. 13/286,301, (70 pgs.).

* cited by examiner

MEMORY CELL SENSING

TECHNICAL FIELD

The present disclosure relates generally to semiconductor memory apparatuses and methods, and more particularly, to memory cell sensing.

BACKGROUND

Memory devices are typically provided as internal, semiconductor, integrated circuits in computers or other electronic apparatuses. There are many different types of memory, including random-access memory (RAM), read only memory (ROM), dynamic random access memory (DRAM), synchronous dynamic random access memory (SDRAM), resistive random access memory (RRAM), phase change random access memory (PCRAM), magnetic random access memory (MRAM), and flash memory, among others.

Uses for flash memory include memory for solid state drives (SSDs), personal computers, personal digital assistants (PDAs), digital cameras, cellular telephones, portable music players (e.g., MP3 players), and movie players, among various other electronic apparatuses. Flash memory cells can be organized in an array architecture (e.g., a NAND or NOR architecture) and can be programmed to a particular (e.g., desired) data state. For instance, electric charge can be placed on or removed from a charge storage structure (e.g., a floating gate or a charge trap) of a memory cell to program the cell into one of two data states, such as to represent one of two binary digits (e.g., 1 or 0).

Flash memory cells can also be programmed to one of more than two data states, such as to represent one of four, eight, or sixteen data states (e.g., 1111, 0111, 0011, 1011, 1001, 0001, 0101, 1101, 1100, 0100, 0000, 1000, 1010, 0010, 0110, and 1110). Such cells may be referred to as multistate memory cells, multiunit cells, or multilevel cells (MLCs). MLCs can allow the manufacture of higher density memories without increasing the physical number of memory cells because each cell can represent more than one digit (e.g., more than one bit). One of the data states can be an erased state. For example, a "lowermost" data state may not be programmed above the erased state. That is, if the cell is programmed to the lowermost data state, the cell remains in the erased state rather than having additional charge added to the charge storage structure of the cell (e.g., during a programming operation). Data states other than the erased state can be referred to as "non-erased" states.

A programmed charge stored on charge storage structures (e.g., floating gates) of flash memory cells can shift due to coupling between charge storage structures of adjacent (e.g., neighboring) cells (e.g., cells coupled to adjacent data lines). For example, in instances in which a particular floating gate memory cell is programmed prior to one or both of the floating gate memory cells on neighboring data lines, the subsequent programming of the cells on the neighboring data lines can shift a threshold voltage (Vt) of the particular cell due to floating gate-to-floating gate (FG-FG) capacitive coupling. Such Vt shifts can affect the resultant data state of the particular cell in response to a sensing (e.g., read) operation and, in some instances, can result in erroneous sensing of the data (e.g., erroneous reading of the resultant data state). Some programming techniques, such as shielded bit line (SBL) programming, can be used to reduce effects of FG-FG coupling. However, as the spacing between adjacent data lines (e.g., bit lines) and access lines (e.g., word lines) is reduced, the effects of FG-FG coupling between adjacent cells can increase.

DETAILED DESCRIPTION

Figure 1:
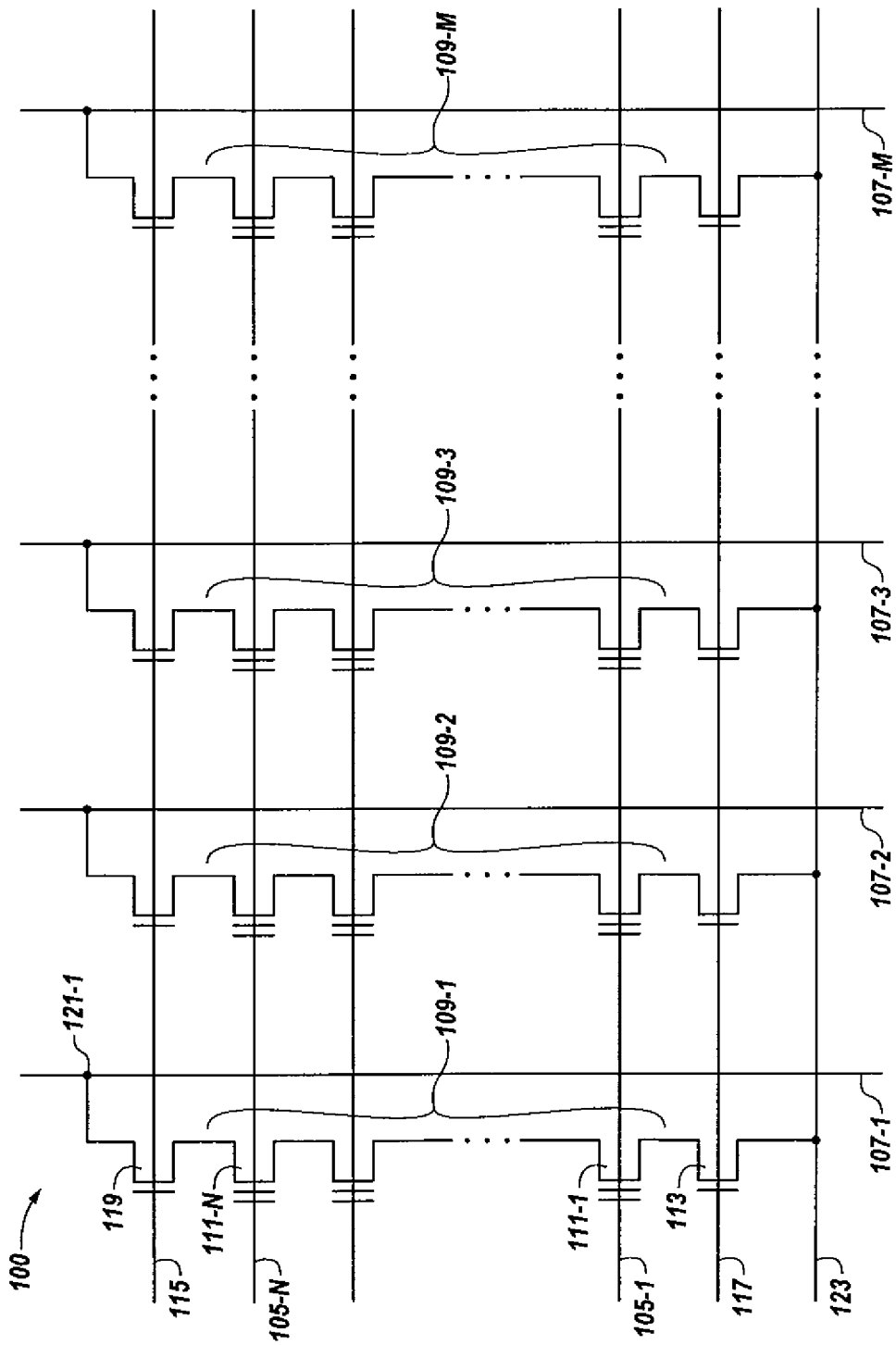
FIG. 1 is a schematic of a portion of a memory array in accordance with a number of embodiments of the present disclosure.

The present disclosure includes apparatuses and methods for sensing memory cells. For example, sensing memory cells can include determining a data state of a first memory cell (e.g., a first aggressor memory cell) coupled to a first data line, determining a data state of a third memory cell (e.g., a second aggressor memory cell) coupled to a third data line, transferring determined data of at least one of the first and the third memory cells to a data line control unit corresponding to a second data line to which a second memory cell (e.g., a target memory cell) is coupled, the second data line being adjacent to the first data line and the third data line, and determining a data state of the second memory cell (e.g., the target memory cell) based, at least partially, on the transferred determined data (e.g., from the first and/or the second aggressor memory cells).

A number of embodiments of the present disclosure can reduce sensing errors (e.g., read errors) caused by charge storage structure to charge storage structure (e.g., FG-FG) coupling as compared to previous sensing approaches. As an example, the data states of a number of memory cells (e.g., aggressor memory cells) adjacent to a target cell to be read can be determined prior to the target cell being read. In a number of embodiments, a plurality of sensing voltages (e.g., different sensing voltages) can be applied to a selected access line to which the target cell and the adjacent memory cells are coupled, which can result in output of a number of potential data states for the target cell. As described further herein, a particular data state from among the number of potential data states can be selected based, at least partially, on the transferred determined data states (e.g., programmed status) of the number of adjacent cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M", particularly with respect to reference numerals in the drawings, indicate that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 105 may reference element "05" in FIG. 1, and a similar element may be referenced as 405 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 illustrates a schematic diagram of a portion of a memory array 100 in accordance with a number of embodiments of the present disclosure. The embodiment of FIG. 1 illustrates a NAND architecture non-volatile memory array. However, embodiments described herein are not limited to this example. As shown in FIG. 1, the memory array 100 includes access lines (e.g., word lines) 105-1, . . . , 105-N and intersecting data lines (e.g., bit lines) 107-1, 107-2, 107-3, . . . , 107-M. For ease of addressing in the digital environment, the number of word lines 105-1, . . . , 105-N and the number of bit lines 107-1, 107-2, 107-3, . . . , 107-M can be some power of two (e.g., 256 word lines by 4,096 bit lines), for instance. Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are coupled in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is coupled to a common source line 123. The drain of source select gate 113 is coupled to the source of the memory cell 111-1 of the corresponding NAND string 109-1. The drain of drain select gate 119 is coupled to bit line 107-1 of the corresponding NAND string 109-1 at drain contact 121-1. The source of drain select gate 119 is coupled to the drain of the last memory cell 111-N, e.g., a floating-gate transistor, of the corresponding NAND string 109-1.

In a number of embodiments, the non-volatile memory cells 111-1, . . . , 111-N include a source, a drain, a charge storage structure, such as a floating gate, and a control gate. The non-volatile memory cells 111-1, . . . , 111-N have their control gates coupled to a word line, 105-1, . . . , 105-N, respectively. A "column" of the non-volatile memory cells includes a number of strings 109 coupled to a given local data line (e.g., bit line) 107. A "row" of the non-volatile memory cells are those memory cells commonly coupled to a given access line (e.g., word line) 105-1, . . . , 105-N. Use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates. Subsets of cells (e.g., in a SBL architecture) coupled to a selected word line (e.g., 105-1, . . . , 105-N) can be programmed and/or sensed (e.g., read) together as a page of memory cells. A programming operation (e.g., a write operation) can include applying a number of programming pulses (e.g., 16V-20V) to a selected word line in order to increase the threshold voltage (Vt) of selected cells coupled to that selected access line to a desired program voltage level corresponding to a desired data state.

In various instances, such as with a SBL architecture, the bit lines 107-1, . . . , 107-M can be separated into even numbered bit lines and odd numbered bit lines. In such cases, cells corresponding to a selected word line and even numbered bit lines can be programmed together and can be referred to as an even page of data. Similarly, cells corresponding to the selected word line and odd numbered bit lines can be programmed together and can be referred to as an odd page of data. The cells coupled to alternating even numbered and odd numbered bit lines (e.g., an even page and an odd page) can be programmed and/or sensed at different times. For instance, even pages associated with selected word lines can be programmed and/or sensed before the odd pages associated with the selected word lines. As noted above, and as described further herein, FG-FG coupling and/or bit line to bit line coupling can influence the determined data states of adjacent (e.g., neighboring) memory cells programmed and/or read at different times (e.g., as even pages and odd pages of data).

An erase operation can include applying a relatively high potential difference between the control gates of the memory cells and their channel regions in order to remove charge (e.g., electrons) from the charge storage structures of the cells. In a NAND array, a block of memory cells including multiple pages of memory cells can be erased together in an erase operation. For example, 20V can be applied to the substrate body and 0V can be applied to the control gates of the cells in a block of memory cells being erased. The high voltage erase pulse, or pulses, is intended to inject electrons from the charge storage structures of the memory cells into the substrate active area.

A sensing operation, such as a read or program verify operation, can include sensing a voltage and/or current change of a bit line coupled to a selected cell in order to determine the data state of the selected cell. The sensing operation can involve applying a signal to (e.g., driving or biasing) a bit line (e.g., bit line 107-1) associated with a selected memory cell above a signal (e.g., bias voltage) applied to a source line (e.g., source line 123) associated with the selected memory cell. A sensing operation may include precharging the bit line 107-1 followed with discharge dependent on the amount of charge stored on the selected memory cell, and then sensing the amount of discharge.

Sensing the data state of a selected cell can include applying a number of sensing signals (e.g., read voltages) to a selected word line while applying a number of pass signals (e.g., read pass voltages) to the word lines coupled to the unselected cells of the string sufficient to place the unselected cells in a conducting state independent of a threshold voltage of the unselected cells. The bit line corresponding to the selected cell being read and/or verified can be sensed to determine whether or not the selected cell conducts in response to the particular sensing voltage applied to the selected word line.

In a sensing operation performed on a selected memory cell in a NAND string, the unselected memory cells of the string are biased so as to be in a conducting state. In such a sensing operation, the data state of the selected cell can be determined based on the current and/or voltage sensed on the bit line corresponding to the string. For instance, the data state of the selected cell can be determined based on whether the bit line current changes by a particular amount or reaches a particular level in a given time period. When the selected cell is in a conductive state, current flows between the source line contact at one end of the string and a bit line contact at the other end of the string. As such, the current associated with sensing the selected cell is carried through each of the other cells in the string and the select transistors.

As described further herein, capacitive coupling, such as FG-FG coupling between a target cell and adjacent memory cells coupled to a selected word line, can affect the Vt of a target cell. For instance, the target cell may be programmed to a particular Vt corresponding to a particular data state. The FG-FG coupling between the target cell and adjacent cells may shift the Vt of the target cell. The amount of shift associated with the FG-FG coupling can depend on factors such as the data state of the target cell's adjacent memory cells (e.g., whether one or both of the adjacent memory cells coupled to the selected word line are programmed to an erased data state or to a non-erased data state). Therefore, maintaining a predetermined sensing voltage to determine the particular data state can be less reliable than selecting which of the data state outputs resulting from application of a plurality of sensing voltages is appropriate based on the data states of the target cell's adjacent memory cells.

The amount of capacitive coupling between adjacent data lines, adjacent memory cells on adjacent data lines, and/or between the data lines and a ground voltage, among others, can depend on various factors such as, for example, a distance between the data lines and/or the memory cells and a voltage on the data lines and/or the memory cells, among other factors. As described further herein, memory cell to memory cell capacitive coupling can be at least partially overcome with sensing operations that determine the data state (e.g., programmed status) of "aggressor" memory cells, which may be capacitatively coupled to a "target" memory cell to be evaluated, to determine the appropriate sensing voltage (e.g., the output data state resulting from that particular sensing voltage) for determining the data state of that target memory cell.

A charge stored by (e.g., by a FG of) an aggressor memory cell (e.g., as applied to a coupled data line) can be changed from a first voltage (e.g, in an erased data state) to a higher second voltage (e.g., in a non-erased data state). The second voltage associated with the non-erased data state of the memory cell can be a value such as about 500 mV, for instance. The particular value of the non-erased data state voltage can vary depending on, for instance, the particular non-erased state of a number of non-erased states (e.g., in a MLC operation) with which the voltage is associated. The first voltage can be a ground voltage (e.g., 0 V), for instance, associated with the erased data state of a memory cell.

There can be a number of possible effects (e.g., induced voltage changes) on a target memory cell in response to voltage changes on a number of adjacent aggressor memory cells, which can be due, at least partially, to capacitive coupling between the aggressor and target memory cells. For instance, consider single level cells (SLCs) rather than MLCs. A charge stored on a target memory cell (e.g., on the FG thereof) may remain unchanged if no aggressor memory cells adjacent to the target memory cell have charges changed from a first voltage (e.g, in the erased data state) to the second voltage (e.g., both aggressor memory cells sharing an access line with the target memory cell remain in the erased data state).

However, a voltage change can be induced on the target memory cell responsive to one of the aggressor memory cells having a stored charge being changed from, for instance, the erased data state to the non-erased data state. The charge on the target memory cell can change (e.g., shift) from a first voltage (e.g, in the erased data state) to a particular second voltage. A greater voltage change can be induced on the target memory cell in response to both adjacent aggressor memory cells having a stored charge being changed, for instance, from the erased data state to the non-erased data state. In addition, the stored charge of a target memory cell in a non-erased data state can be similarly elevated. The magnitude of such changes in stored charge on the target cell can be determined by experimental observation.

A sensing voltage appropriate to read the data state of the target cell can depend on the data states (e.g., programmed status) of, for example, two aggressor cells adjacent to each respective target cell (e.g., whether zero, one, or both aggressor cells are at a non-erased data state or an erased data state). However, sensing voltages applied to access lines (e.g., to which aggressor memory cells and target memory cells are coupled) are determined prior to a sensing (e.g., read) operation.

Accordingly, a plurality of sensing voltages can be applied to a selected access line to which the target memory cell is coupled to output a number of potential data states for the target memory cell. For instance, for a SLC, a first sensing voltage determined to be appropriate to read those target cells whose adjacent aggressor cells are both at a first data state (e.g., the erased data state) can be applied to the selected access line to read those target cells whose adjacent aggressor cells are at the first data state (e.g., the erased data state). A second sensing voltage determined to be appropriate to read those target cells whose adjacent aggressor cells include a first aggressor at the first state (e.g., the erased data state) and a second aggressor at a second state (e.g., the non-erased data state) can be applied to the selected access line to read those target cells whose adjacent aggressor cells include a first aggressor at the first state and a second aggressor at a second state. A third sensing voltage determined to be appropriate to read those target cells whose adjacent aggressor cells are both at the second data state (e.g., the non-erased data state) can be applied to the selected access line to read those target cells whose adjacent aggressor cells are both at the second data state.

In cases in which the memory cells are MLCs, the appropriate sensing voltage to read the data state of the target cell can also depend on the particular non-erased states to which the aggressor cells are programmed (e.g., whether the aggressor cells are programmed to an uppermost non-erased data state or one of a number of intermediate non-erased data states). Accordingly, more than the three sensing voltages just described may be applied to the selected access line based on the potential data state combinations of the aggressor cells.

Figure 2:
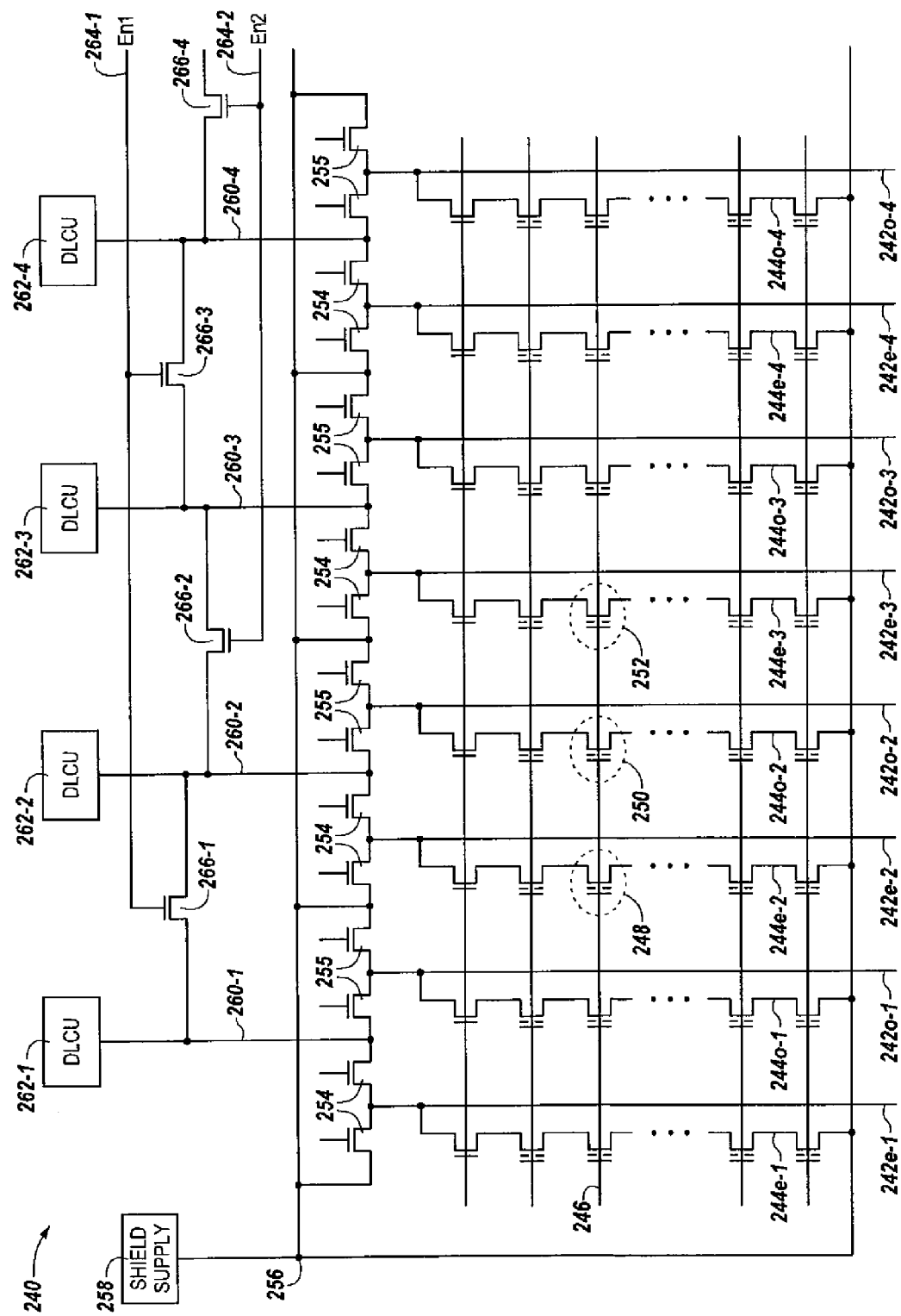
FIG. 2 is a schematic of a portion of a memory array including data line control units shared by adjacent pairs of data lines in accordance with a number of embodiments of the present disclosure.

FIG. 2 is a schematic of a portion of a memory array 240 including data line control units shared by adjacent pairs of data lines in accordance with a number of embodiments of the present disclosure. In this example, respective pairs of even-numbered and odd-numbered adjacent data lines share a common data line control unit (e.g., a DLCU). For instance, even-numbered data line 242*e*-1 and odd-numbered data line 242*o*-1 share a common DLCU 262-1, data lines 242*e*-2 and 242*o*-2 share a common DLCU 262-2, data lines 242*e*-3 and 242*o*-3 share a common DLCU 262-3, and data lines 242*e*-4 and 242*o*-4 share a common DLCU 262-4. Each of the DCLUs (e.g., 262-1, 262-2, 262-3, and 262-4) illustrated in FIG. 2 can be selectively coupled to a pair of even-numbered and odd-numbered data lines via circuitry (e.g., via interface lines) 260-1, 260-2, 260-3, and 260-4). The data lines illustrated in FIG. 2 can be data lines such as those illustrated in FIG. 1, for example.

The memory array 240 shown in FIG. 2 can include a number of isolation devices 254 and 255 (e.g., transistors), which can be operated (e.g., turned on/off via application of a control signal) to selectively couple one of the data lines of an even/odd pair to a respective one of the DLCUs 262-1, 262-2, 262-3, and 262-4 (e.g., via interface lines 260-1, 260-2, 260-3, and 260-4). For example, transistors 254 and 255 can be operated to select which one of the data lines of the respective even/odd pair of data lines (e.g., 242*e*-1/242*o*-1, 242*e*-2/242*o*-2, 242*e*-3/242*o*-3, and 242*e*-4/242*o*-4) is to be selectively coupled to its respective DLCU 262-1, 262-2, 262-3, and 262-4. For example, differing control signals can be used to control the transistors 254 and 255. As utilized herein, "to couple" indicates that the described components are directly connected by circuitry, whereas "to selectively couple" indicates that the described components are optionally connected by circuitry (e.g., via a switch, for example, a transistor).

The DLCUs 262-1, 262-2, 262-3, and 262-4 can, for instance, receive (e.g., via a host and/or controller) data to be programmed to memory cells selectively coupled to a respective even/odd pair of data lines 242*e*-1/242*o*-1, 242*e*-2/242*o*-2, 242*e*-3/242*o*-3, and 242*e*-4/242*o*4. Similarly, the DLCUs 262-1, 262-2, 262-3, and 262-4 can transmit data to be read from memory cells selectively coupled to a respective even/odd pair of data lines 242*e*-1/242*o*-1, 242*e*-2/242*o*-2, 242*e*-3/242*o*-3, and 242*e*-4/242*o*-4 (e.g., in response to a read request from a host and/or controller). As shown in FIG. 2, a subset of memory cells is coupled to each data line. For example, memory cell strings 244*e*-1, 244*e*-2, 244*e*-3, and 244*e*-4 are coupled to the even data lines 242*e*-1, 242*e*-2, 242*e*-3, and 242*e*-4 and memory cell strings 244*o*-1, 244*o*-2, 244*o*-3, and 244*o*-4 are coupled to the odd data lines 242*o*-1, 242*o*-2, 242*o*-3, and 242*o*-4. As such, subsets of memory cells coupled to a selected access line can be programmed and/or read at different times. For example, memory cells coupled to a selected access line (e.g., 246) and to even data lines (e.g., 242*e*-1, 242*e*-2, 242*e*-3, and 242*e*-4) can be programmed and/or read at the same time (e.g., in parallel) and memory cells coupled to the selected access line (e.g., 246) and to odd data lines (e.g., 242*o*-1, 242*o*-2, 242*o*-3, and 242*o*-4) can be programmed and/or read in parallel.

As examples, in operation, memory cells coupled to even data lines (e.g., 242*e*-1, 242*e*-2, 242*e*-3, and 242*e*-4) may be programmed to their desired (e.g., final) data states prior to cells coupled to odd data lines (e.g., 242*o*-1, 242*o*-2, 242*o*-3, and 242*o*-4). As a result, the subsequent programming of the cells coupled to the odd data lines may shift the programmed Vt of the cells coupled to the even data lines (e.g., due to capacitive coupling). As such, the cells coupled to even data lines may be target cells and the cells coupled to adjacent odd data lines may be aggressor cells. In addition or alternatively, memory cells coupled to odd data lines (e.g., 242*o*-1, 242*o*-2, 242*o*-3, and 242*o*-4) may be programmed to their desired (e.g., final) data states (e.g., erased) prior to cells coupled to even data lines (e.g., 242*e*-1, 242*e*-2, 242*e*-3, and 242*e*-4) and subsequent programming of the cells coupled to the even data lines may shift the programmed Vt of the cells coupled to the odd data lines (e.g., due to capacitive coupling). As such, the cells coupled to odd data lines may be target cells and the cells coupled to adjacent even data lines may be aggressor cells.

Determining the particular data states of aggressor cells can be useful in sensing (e.g., reading) the data states of the target cells. For instance, the data state of an aggressor cell (e.g., whether the aggressor cell is in an erased data state or a non-erased data state) can indicate whether or not the Vt of the target cell changed during the programming of the aggressor cell (e.g., due to capacitive coupling). As such, a plurality of sensing voltages can be applied to the selected access line to sense the data state of a target cell (e.g., in a read operation). Applying the plurality of sensing voltages can output (e.g., yield) a number of data states for the target memory cell. A particular number for the data states can depend on the resultant charge stored by the target cell and how each of the plurality of sensing voltages reads that particular resultant stored charge, among other factors. As described herein, a particular data state from among the number of data states can be selected based, at least partially on the particular data states of the aggressor cells.

Therefore, it can be beneficial to incorporate the data states of aggressor memory cells into a sensing (e.g., read) operation performed on a target memory cell. However, in instances such as FIG. 2, in which pairs of data lines share one common DLCU (e.g., DLCUs 262-1, 262-2, 262-3, and 262-4), it can be difficult to provide determined data states of both aggressor cells to the DLCU associated with the target cell.

As an example, as shown in FIG. 2, consider the case of a request to sense the data state of a memory cell 250 coupled to a selected access line 246 and to odd data line 242*o*-2, such that memory cell 250 is a target memory cell and memory cell 248 coupled to even data line 242*e*-2 and memory cell 252 coupled to even data line 242*e*-3, both of which are also coupled to the selected access line 246, are two adjacent aggressor memory cells. In such instances, a read operation can be performed on the aggressor cells (e.g., the cells 248 and 252 coupled to even data lines 242*e*-2 and 242*e*-3) in response to the request to sense the data state of the target cell (e.g., the cell 250 coupled to odd data line 242*o*-2). The DLCU 262-2 shared by the data line 242*o*-2 of the target cell 250 and the data line 242*e*-2 of one adjacent aggressor cell 248 can be used to determine the data state, and can store the determined data state, of the aggressor cell 248 coupled to data line 242*e*-2.

Although the DLCU associated with the data line of the target cell (e.g., DLCU 262-2 associated with data line 242*o*-2 and cell 250, in this example) stores the data state of the aggressor cell coupled to the data line that shares the same DLCU (e.g., DLCU 262-2 associated with data line 242*e*-2 and cell 248, in this example), it can be difficult for the DLCU associated with the target memory cell (e.g., DLCU 262-2, in this example) to obtain status information of an aggressor cell that is stored in an adjacent DLCU (e.g., DLCU 262-3 associated with data line 242*e*-3 and cell 252, in this example).

Hence, as described in the present disclosure, in order for a DLCU to obtain the data states (e.g., programmed statuses) of both aggressor cells, data transfer circuitry (e.g., shift logic in the form of a number of data transfer devices (DTDs), such as transistors 266-1, 266-2, 266-3, and 266-4, which can include various configurations) is used to transfer a stored data state corresponding to an aggressor memory cell from one DLCU to another DLCU (e.g., from DLCU 262-3 to DLCU 262-2). As utilized herein, to transfer information (e.g., transferring a stored data state from one DLCU to another DLCU and/or to or between other components, as described herein) also includes to exchange and/or supply such information.

For example, as shown in FIG. 2, DTDs can include the transistors 266-1, 266-2, 266-3, and 266-4 selectively coupled by circuitry such that a number of "enable signals"

can be transmitted to enable or disable exchange of signals (e.g., information on data states of selectively coupled memory cells) between DLCUs. For example, the transistors of DTDs 266-1 and 266-3 controlled by enable signal 1 (En1) 264-1 and the transistors of DTDs 266-2 and 266-4 controlled by enable signal 2 (En2) 264-2 can be operated (e.g., turned on/off via application of the enable signal) to selectively couple one of the DLCUs to another one or more of the DLCUs for transfer of information regarding stored data states of memory cells selectively coupled to the corresponding DLCUs (e.g., data states obtained via interface lines 260-1, 260-2, 260-3, and 260-4). In the example shown in FIG. 2, the data state (e.g., programmed status) of aggressor memory cell 252 selectively coupled to DLCU 262-3 can be transferred to DLCU 262-2, which already has the data state of aggressor memory cell 248, by transmission of the En2 264-2 turning on the transistor of DTD 266-2.

In some examples, as an alternative or in addition, data states (e.g., programmed statuses) of adjacent memory cells (e.g., target memory cell 250 and aggressor memory cell 252) can be transferred to, from, and/or between the associated DLCUs (e.g., DLCU 262-2 and DCLU 262-3, respectively) by selectively coupling the associated DLCUs via the isolation devices 254 and 255 (e.g., transistors). For example, the isolation devices 254 and 255 (e.g., transistors) can be operated (e.g., turned on/off via application of a control signal) to selectively couple DLCUs 262-1, 262-2, 262-3, and 262-4 (e.g., via the interface lines 260-1, 260-2, 260-3, and 260-4) associated with the adjacent memory cells.

Determining the data state of the target memory cell 250 can be determined based, at least partially, on the determined data states of aggressor cells 248 and 252. As an alternative or in addition, the data state (e.g., programmed status) of aggressor memory cell 252 selectively-coupled to DLCU 262-3 can be transferred to DLCU 262-2, which already has the data state of the aggressor memory cell 248 plus a plurality of possible data states for the target memory cell 250, by transmission of the En2 264-2 turning on the transistor of DTD 266-2. Determining a resultant data state of the target memory cell 250 can be determined by collecting these data states and post-processing the same (e.g., using processor 482 shown in FIG. 4).

As described herein, aggressor cells and target cells are not necessarily directly adjacent to each other (e.g., as shown in FIG. 2 with target cell 250 sharing the same access line 246 with aggressor cells 248 and 252, which are on directly adjacent data lines 242*e*-2 and 242*e*-3, respectively). Accordingly, relative locations of the aggressor cells and target cells may be positioned throughout the array 240 (e.g., depending upon the configuration of the memory array, the voltage of the aggressor cell and/or the target cell, among other considerations). Hence, to indicate other possible locations of aggressor cells vis a vis associated target cells and abilities of DCLUs and DTDs to compensate for charge storage structure to charge storage structure coupling between them (e.g., FG-FG capacitive coupling), FIG. 2 illustrates additional data lines (e.g., 242*e*-1, 242*o*-1, 242*o*-3, 242*e*-4, and 242*o*-4), additional memory cell strings (e.g., 244*e*-1, 244*o*-1, 244*o*-3, 244*e*-4, and 244*o*-4), additional access lines, additional DLCUs (e.g., 262-1 and 262-4), among other components, by way of example and not by way of limitation.

As utilized in the present disclosure, "adjacent", "adjacent to", and "neighboring" can indicate memory cells and/or data lines that are positioned closely enough to cause induction of a shift in voltage (e.g., by capacitive coupling). For instance, a particular memory cell may be programmed with a voltage high enough to cause the particular memory cell to become an aggressor cell to a number of other memory cells (e.g., target cells). Accordingly, these target cells may (e.g., depending upon the configuration of the memory array, the voltage of the aggressor cell and/or the target cell, among other considerations) be located on the same data line as the aggressor cell, a data line directly adjacent to the data line of the aggressor cell, a data line not directly adjacent to the data line of the aggressor cell (e.g., having another intervening data line), the same access line as the aggressor cell, a different access line from the aggressor cell (e.g., diagonally positioned in the array), among other possible locations.

Some examples of memory arrays consistent with the present disclosure (e.g., memory array 240 as shown in FIG. 2) can utilize SBL programming with a shield voltage supply 258 and a shield voltage supply line 256 in an attempt to reduce effects of FG-FG coupling. However, as the spacing between adjacent data lines and access lines is reduced, the effects of FG-FG coupling between adjacent cells can at least partially overcome the shielding effect. Hence, overcoming effects caused, at least partially, by FG-FG coupling by transferring data states of adjacent aggressor memory cells to a DLCU of a target memory cell, whether or not the aggressors and the target share the same DCLU, can further compensate for the effects of the FG-FG coupling. For example, the appropriate data state output resulting from applying a plurality of sensing voltages to an access line for the target cell can be selected based on the information stored by the target cell's DCLU concerning the data states of adjacent aggressor memory cells.

Accordingly, in a number of embodiments, an apparatus (e.g., a memory device and/or a system), can comprise an array (e.g., array 240) including a first data line (e.g., 242*e*-2) coupled to a first memory cell (e.g., aggressor memory cell 248) and a second data line (e.g., 242*o*-2) coupled to a target memory cell (e.g., 250), where the first and target memory cells are adjacent and share a first DLCU (e.g., 262-2) configured to determine a data state of the first memory cell. The apparatus can include a third data line (e.g., 242*e*-3) coupled to a second memory cell (e.g., aggressor memory cell 252), where the second memory cell is adjacent to the target memory cell and has a second DLCU (e.g., 262-3) associated therewith configured to determine a data state of the second memory cell.

The apparatus can include, in a number of embodiments, a number of DTDs (e.g., 266-2) selectively coupled to the first DLCU (e.g., 262-2) and the second DLCU (e.g., 262-3). The combination of the DTDs and the DLCUs is configured to enable the apparatus to transfer, via the number of DTDs, the determined data state of the second memory cell (e.g., aggressor memory cell 252) from the second DLCU (e.g., 262-3) to the first DLCU (e.g., 262-2). In a number of embodiments, the data state of the second memory cell (e.g., aggressor memory cell 252) can be determined in response to a request to sense the data state of the target memory cell (e.g., 250).

In a number of embodiments, the first DLCU (e.g., 262-2) can be configured to determine a data state of the target memory cell (e.g., 250) coupled to the second data line (e.g., 242*o*-2) based, at least partially, on the determined data state of the first memory cell (e.g., aggressor memory cell 248) coupled to the first data line (e.g., 242*e*-2) and the determined data state of the second memory cell (e.g., aggressor memory cell 252) coupled to the third data line (e.g., 242*e*-3). The first DLCU (e.g., 262-2) can be configured to determine a data state of the target memory cell (e.g., 250) based, at least partially, on a number of data states output by application of a plurality of sensing voltages to a selected access line (e.g., 246) to which the target memory cell (e.g., 250) is coupled.

Figure 3:
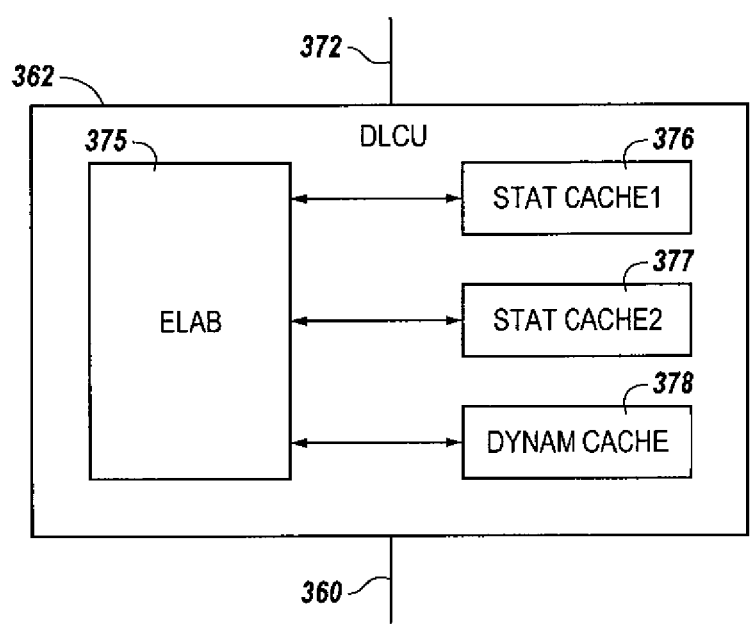
FIG. 3 is a block diagram illustrating a shared data line control unit in accordance with a number of embodiments of the present disclosure.

FIG. 3 is a block diagram illustrating a shared DLCU 362 in accordance with a number of embodiments of the present disclosure. The DLCU 362 can, for example, be a DLCU such as DLCUs 262-1, 262-2, 262-3, and 262-4 described in connection with FIG. 2. The DLCU 362 can be shared by an even/odd pair of data lines of a memory array and can be selectively coupled thereto via an isolation device (e.g., isolation devices 254 and 255 shown in FIG. 2) selectively coupled to an interface line 360 (e.g., interface lines 260-1, 260-2, 260-3, and 260-4 shown in FIG. 2). That is, the DLCU 362 can be included in an architecture in which each even/odd data line pair shares one DLCU.

The DLCU 362 can be used to operate a memory apparatus in accordance with embodiments described herein. For instance, DLCU 362 can be used in association with sensing (e.g., reading) memory cells in accordance with a number of embodiments of the present disclosure. Each DLCU 362 (e.g., DLCUs 262-1, 262-2, 262-3, and 262-4 described in connection with FIG. 2) can be configured to store data states of memory cells associated with a data line selectively coupled thereto and to transfer stored data states of memory cells selectively coupled to a different DLCU (e.g., a DLCU associated with a target memory cell). As an example, a DTD (such as DTDs 266-1, 266-2, 266-3, and 266-4 described in connection with FIG. 2) can be used in association with transferring a stored data state from one DLCU to another DLCU. The DLCU 362 (e.g., DLCUs 262-1, 262-2, 262-3, and 262-4 described in connection with FIG. 2) can be used to select an appropriate data state output resulting from applying a plurality of sensing voltages to a selected access line coupled to a target memory cell (e.g., selected access line 246 coupled to target cell 250 shown in FIG. 2) in order to determine the data state of the target memory cell. These and other data operations can be performed, for instance, by an elaboration component (ELAB) 375 of each DLCU 362.

The DLCU 362 also includes a number of data cache components. The data cache components can include a number of static data caches (e.g., STAT CACHE 1 at 376 and STAT CACHE 2 at 377) that input saved data to ELAB 375 and/or save output data from ELAB 375, a number of dynamic caches (e.g., DYNAM CACHE at 378), primary data caches and/or secondary data caches (not shown), combinational elements (e.g., that perform AND/OR operations, among other functions), and/or other memory and/or circuitry. In some embodiments, the DLCU 362 and/or associated components can be coupled to an external circuit (e.g., a controller, processor, and/or other external circuitry) via an interface line 372. In a number of embodiments, the DLCU 362 can be used to determine the data state (e.g., programmed status) of an aggressor memory cell coupled to a data line other than to its associated data line even/odd pair by receiving the data state of the aggressor cell (e.g., via interface line 360) from another DLCU to which a data line of the aggressor cell is selectively coupled.

The CACHE 1 at 376, the STAT CACHE 2 at 377, and DYNAM CACHE at 378, along with other components of DLCU 362 not shown in FIG. 3, can, in a number of embodiments, be used to store and/or exchange determined data states. For example, these caches can be used to store and/or exchange determined data states for aggressor memory cells selectively coupled to the same DLCU (e.g., aggressor memory cell 248 selectively coupled to DLCU 262-2 in FIG. 2) and/or for aggressor memory cells selectively coupled to an adjacent DLCU (e.g., aggressor memory cell 252 selectively coupled to DLCU 262-3 in FIG. 2). In some examples, the aggressor cells can share the same access line (e.g., access line 246 in FIG. 2) with the target memory cell (e.g., target memory cell 250 selectively coupled to DLCU 262-2 in FIG. 2). These data caches can supply and/or exchange information concerning, for example, determined data states to and/or with the ELAB 375 component.

Hence, as described herein, the determined data states of two or more adjacent aggressor memory cells can be incorporated into a read operation performed on a target memory cell coupled to a data line of the even/odd pair selectively coupled to DLCU 362. For instance, among other operations, ELAB 375 can determine an appropriate output data state from among a number of output states that result from application of a plurality of different sensing voltages to a target memory cell based, at least partially, on the determined data states of the two or more adjacent aggressor memory cells, as described in the various embodiments of the present disclosure.

Figure 4:
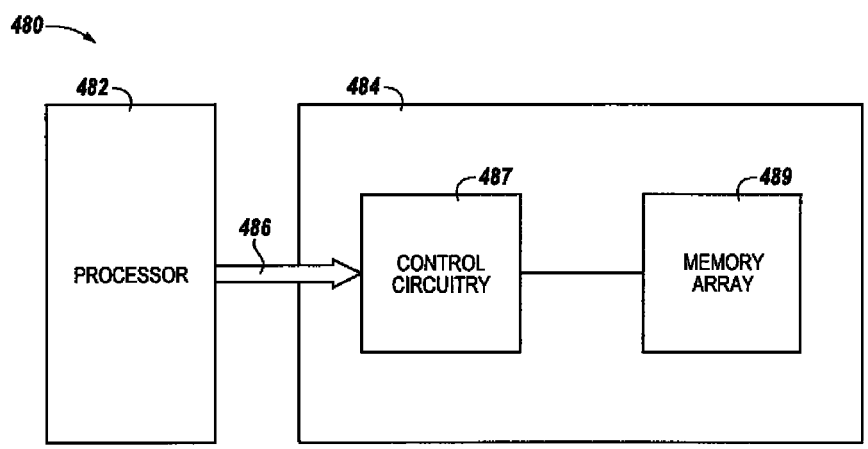
FIG. 4 illustrates a block diagram of an apparatus in the form of an electronic memory system having a memory device operated in accordance with a number of embodiments of the present disclosure.

FIG. 4 illustrates a block diagram of an apparatus in the form of an electronic memory system 480 having a memory device 484 operated in accordance with a number of embodiments of the present disclosure. The memory system 480 can include a number of processors 482, a computing device including a number of processors 482, and/or an application specific integrated circuit (ASIC), coupled to (e.g., 486) the memory device 484, which can itself be considered an "apparatus". The memory device 484 can include a memory array 489. The memory array 489 can be analogous to the memory arrays 100 and 240 described herein in connection with FIG. 1 and FIG. 2, respectively. Although one memory array 489 is shown in FIG. 4, embodiments of the present disclosure are not so limited. The memory array 489 of memory device 484 can include, for example, floating gate flash memory cells with a NAND architecture, as described herein.

The memory device 484 includes control circuitry 487 (e.g., a controller) coupled to the memory array 489. The controller 487 can be configured to control performance of various operations such as sensing (e.g., read) operations on memory cells in accordance with one or more embodiments described herein. The controller 487 can control sensing of data in the memory array 489 by, for example, controlling sensing of data states (e.g., programmed status) of the memory cells of the memory array 489 using sensing circuitry (e.g., DLCUs). The controller 487 can control application of the plurality of different sensing voltages to a particular access line and/or determination of the number and/or particular voltages of the plurality of different sensing voltages based, for example, on the potential data state combinations of the adjacent aggressor cells. In a number of embodiments, the controller 487 is responsible for executing instructions from the processor 482 to perform the operations according to embodiments of the present disclosure. The controller 487 can be a state machine, a sequencer, or some other type of controller. It will be appreciated by those skilled in the art that additional circuitry and control signals can be provided, and that the memory device detail of FIG. 4 has been reduced to facilitate ease of illustration.

As described herein, in a number of embodiments of the present disclosure, apparatuses, such as those illustrated in FIGS. 2-4, can include a first data line (e.g., 242e-2) coupled to a first memory cell (e.g., aggressor memory cell 248) and a second data line (e.g., 242o-2) coupled to a target memory cell (e.g., 250), where the first memory cell is adjacent to the target memory cell. A third data line (e.g., 242e-3) can be coupled to a second memory cell (e.g., aggressor memory cell 252), where the second memory cell is adjacent to the target memory cell. A number of embodiments can comprise circuitry (e.g., DLCUs 262-2, 262-3, and 362, DTD 266-2, En1 264-1, Ent 264-2, control circuitry 487, etc.). The circuitry can, in a number of embodiments, be configured to determine a data state of the first memory cell (e.g., aggressor memory cell 248) coupled to a selected access line (e.g., 246) and to the first data line (e.g., 242e-2) in response to a request to sense a data state of the target memory cell (e.g., 250) coupled to the selected access line (e.g., 246) and to the second data line (e.g., 242o-2). The circuitry can further be configured to determine a data state of the second memory cell (e.g., aggressor memory cell 252) coupled to the selected access line (e.g., 246) and to the third data line (e.g., 242e-3) in response to the request to sense the data state of the target memory cell (e.g., 250) coupled to the selected access line (e.g., 246) and to the second data line (e.g., 242o-2). In addition, the circuitry can be configured to determine a data state of the target memory cell (e.g., 250) coupled to the selected access line (e.g., 246) and to the second data line (e.g., 242o-2) based, at least partially, on the determined data state of the first memory cell (e.g., aggressor memory cell 248) and the determined data state of the second memory cell (e.g., aggressor memory cell 252).

The circuitry can, in a number of embodiments, be configured to apply a plurality of sensing voltages to the selected access line (e.g., 246), the plurality of sensing voltages based, at least partially, on potential data state combinations of the first and second memory cells (e.g., aggressor memory cells 248 and 252) and where the plurality of sensing voltages output a number of data states. The circuitry can be configured to, as described in a number of embodiments herein, select one of the number of data states based, at least partially, on the determined data states.

In a number of embodiments, the circuitry can include a number of DTDs (e.g., 266-2) to transfer, to a first DLCU (e.g., 262-2) shared between the first memory cell (e.g., aggressor memory cell 248) and the target memory cell (e.g., 250), the determined data state of the second memory cell (e.g., aggressor memory cell 252). The number of DTDs (e.g., 266-2) can, in a number of embodiments, be selectively coupled between an interface line (e.g., 260-2) of the first DLCU (e.g., 262-2) and an interface line (e.g., 266-3) of a second DLCU (e.g., 262-3). An enable signal (e.g., En1 264-1 and/or En2 264-2) can enable the number of DTDs to transfer the determined data state of the second memory cell (e.g., aggressor memory cell 252) to the first DLCU (e.g., 262-2). Each DTD can, in a number of embodiments, comprise a transistor (e.g., 266-2) having a first terminal (e.g., source/drain) coupled to the interface line (e.g., 260-2) of the first DLCU (e.g., 262-2), a second terminal (e.g., source/drain) coupled to the interface line (e.g., 260-3) of the second DLCU (e.g., 262-3), and a gate configured to receive the enable signal (e.g., En2 264-2).

As described herein, in a number of embodiments of the present disclosure, apparatuses, such as those illustrated in FIGS. 2-4, can include a first data line (e.g., 242e-2) coupled to a first memory cell (e.g., aggressor memory cell 248) and to a first DLCU (e.g., 262-2) and a second data line (e.g., 242o-2) coupled to a second memory cell (e.g., target memory cell 250) and to the first DLCU (e.g., 262-2), the second data line adjacent to the first data line. The apparatus can include a third data line (e.g., 242e-3) coupled to a third memory cell (e.g., aggressor memory cell 252) and to a second DLCU (e.g., 262-3), the third data line adjacent to the second data line.

In a number of embodiments, control circuitry such as control circuitry 487 (e.g., a controller, which can be coupled to an array such as shown array 240 shown in FIG. 2 or array 489 shown in FIG. 4) can be configured to determine a data state of the second memory cell (e.g., target memory cell 250). The data state of the second memory cell (e.g., target memory cell 250) can be based, at least partially, on at least one of a determined data state of the third memory cell (e.g., aggressor memory cell 252) transferred from the second DLCU (e.g., 262-3) to the first DLCU (e.g., 262-2) and a determined data state of the first memory cell (e.g., aggressor memory cell 248) determined by the first DLCU (e.g., 262-2). The control circuitry 487 can, in a number of embodiments, be configured to apply a plurality of sensing voltages to a selected access line (e.g., 246) to which the second memory cell (e.g., target memory cell 250) is coupled to output a number of data states and to select one of the number of data states based, at least partially, on the determined data states.

A first DTD (e.g., 266-2) can, in a number of embodiments, be selectively coupled between an interface line (e.g., 260-2) of the first DLCU (e.g., 262-2) and an interface line (e.g., 260-3) of the second DLCU (e.g., 262-3) and a second DTD (e.g., 266-3) can be selectively coupled between the interface line (e.g., 260-3) of the second DLCU (e.g., 262-3) and an interface line (e.g., 260-4) of a third DLCU (e.g., 262-4). In some embodiments, the first DLCU can be a shared DLCU (e.g., 262-2 in an SBL architecture), the first and the second data lines (e.g., 242e-2 and 242o-2) being selectively coupled (e.g., via isolation devices 254 and 255) to the shared DLCU (e.g., 262-2).

A number of methods for operating a memory, which can comprise an array (e.g., 240) such as those illustrated in FIGS. 2-4, can include determining a data state of a first memory cell (e.g., aggressor memory cell 248) coupled to a first data line (e.g., 242e-2), determining a data state of a third memory cell (e.g., aggressor memory cell 252) coupled to a third data line (e.g., 242e-3), transferring determined data of at least one of the first and the third memory cells to a DLCU (e.g., 262-2) corresponding to a second data line (e.g., 242o-2) to which a second memory cell (e.g., target memory cell 250) is coupled, the second data line being adjacent to the first data line and the third data line. Such methods can, in a number of embodiments, include determining a data state of the second memory cell (e.g., target memory cell 250) based, at least partially, on the transferred determined data.

The method can, in a number of embodiments, include selectively coupling (e.g., via isolation devices 254 and 255) the DLCU (e.g., 262-2) to the first data line (e.g., 242e-2) or the second data line (e.g., 242o-2). In some embodiments, the DLCU can comprise a dynamic data cache.

In a number of embodiments, the method can include determining the data states of the first memory cell (e.g., aggressor memory cell 248) and the third memory cell (e.g., aggressor memory cell 252) in response to a request to sense the data state of the second memory cell (e.g., target memory cell 250). Determining the data state of the target memory cell can be performed by applying a plurality of sensing voltages to a selected access line (e.g., 246) to which the target memory cell is coupled to output a number of data states and selecting one of the number of data states based, at least partially, on the transferred determined data. As such, the data state selected from among the plurality of data states of the target memory cell can be based, at least partially, on the determined data states of the aggressor memory cells (e.g., the transferred determined data states).

The method can, in a number of embodiments, include programming the first memory cell, the second memory cell, and the third memory cell in accordance with an SBL technique prior to determining the data states of the first, second, and/or third memory cells. Operating the memory can, in a number of embodiments, include operating the first, second, and/or the third memory cells as MLCs.

In a number of embodiments, a method of operating a memory can include determining data stored by a first memory cell (e.g., aggressor memory cell 248) coupled to a first data line and a second memory cell (e.g., aggressor memory cell 252) coupled to a third data line. The determined data stored by at least one of the first memory cell and the second memory cell can be transferred to a first DLCU selectively coupled to a second data line to which a target memory cell is coupled. The second data line can be adjacent to the first data line and the third data line, and the method can include sensing data stored by the target memory cell (e.g., 250) using a plurality of sensing voltages applied to a selected access line to which the first memory cell, the second memory cell, and the target memory cell are coupled. In a number of embodiments, the sensing voltages are based, at least partially, on potential data state combinations of the first and second memory cells (e.g., aggressor memory cells 248 and 252).

Determining the potential data state combinations of the first and second memory cells (e.g., aggressor memory cells 248 and 252) can, in a number of embodiments, be based on a combination of charges storable on the first and second memory cells. In addition or in the alternative, determining the potential data state combinations of the first and second memory cells can, in a number of embodiments, be based on a combination of an erased state and non-erased states for each of the first and second memory cells.

In a number of embodiments, the method can include determining the data states of the first memory cell and the second memory cell (e.g., aggressor memory cells 248 and 252) in response to a request to determine the data stored by the target memory cell (e.g., 250). The first memory cell and the target memory cell can be selectively coupled to the first DLCU and the second memory cell can be selectively coupled to a second DLCU. In a number of embodiments, the first DLCU and the second DLCU can be selectively coupled to a DTD. Accordingly, the method, in a number of embodiments, can include transferring, via the DTD, the determined data stored by the second memory cell (e.g., aggressor memory cell 252) from the second DLCU to the first DLCU selectively coupled to the first memory cell (e.g., aggressor memory cell 248) and the target memory cell (e.g., 250).

In a number of embodiments of the present disclosure, a method of operating a memory can include determining a data state of a first memory cell (e.g., aggressor memory cell 248) coupled to a first data line in response to a request to sense a data state of a target memory cell (e.g., 250) coupled to a second data line adjacent the first data line, where the first and second data lines are selectively coupled to a first shared DLCU. The method can include determining a data state of a second memory cell (e.g., aggressor memory cell 252) coupled to a third data line adjacent to the second data line in response to the request to sense the data state of the target memory cell (e.g., 250), where the third data line is selectively coupled to a second shared DLCU. The method can, in a number of embodiments, include transferring the determined data state of the second memory cell (e.g., aggressor memory cell 252) from the second shared DCLU to the first shared DCLU and determining the data state of the target memory cell (e.g., 250) based, at least partially, on the transferred determined data state of the second memory cell (e.g., aggressor memory cell 252).

In a number of embodiments, the method can include transferring the determined data state of the second memory cell (e.g., aggressor memory cell 252) to the first shared DLCU via a DTD selectively coupled between an interface line of the first shared DLCU and an interface line of the second shared DLCU. Transferring the determined data state of the second memory cell (e.g., aggressor memory cell 252) to the first shared DLCU can be performed responsive to an enable signal provided to the DTD.

In a number of embodiments, the method can include determining the data state of the target memory cell (e.g., 250) based, at least partially, on at least one of the transferred determined data state of the second memory cell (e.g., aggressor memory cell 252) and the determined data state of the first memory cell (e.g., aggressor memory cell 248 transferred to a first DLCU selectively coupled to the target memory cell). Determining the data state of the target memory cell can, in a number of embodiments, include applying a plurality of sensing voltages to a selected access line to which the first memory cell, the target memory cell, and the second memory cell are coupled, the plurality of sensing voltages based, at least partially, on potential data state combinations of the first and second memory cells (e.g., aggressor memory cells 248 and 252). The plurality of sensing voltages can correspond to a number of possible data states to which the first and second memory cells are programmable, and where the method can include selecting one of a number of output data states based, at least partially, on the determined data states of the first and second memory cells.

CONCLUSION

The present disclosure includes apparatuses and methods for sensing memory cells. For example, sensing memory cells can include determining a data state of a first memory cell coupled to a first data line, determining a data state of a third memory cell coupled to a third data line, transferring determined data of at least one of the first and the third memory cells to a data line control unit corresponding to a second data line to which a second memory cell is coupled, the second data line being adjacent to the first data line and the third data line, and determining a data state of the second memory cell based, at least partially, on the transferred determined data.

It will be understood that when an element is referred to as being "adjacent," "adjacent to," or "coupled to" another element, it can be directly adjacent, adjacent to, or coupled to the other element or intervening elements may be present. In contrast, when an element is referred to as being "directly adjacent," "directly adjacent to," or "directly coupled to" another element, there are no intervening elements or layers present.

As used herein, the term "and/or" includes any and all combinations of one or more of the associated listed items. As used herein the term "or," unless otherwise noted, means a logically inclusive or. That is, "A or B" can include (only A), (only B), or (both A and B). In other words, "A or B" can mean "A and/or B" or "one or more of A and B."

It will be understood that, although the terms first, second, third, etc., may be used herein to describe various elements, these elements should not be limited by these terms. These terms are only used to distinguish one element from another element. Thus, a first element could be termed a second element or a third element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure need to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory, comprising:
   determining a data state of a first memory cell coupled to a first data line;
   determining a data state of a third memory cell coupled to a third data line;
   transferring the determined data state of at least one of the first and the third memory cells to a data line control unit corresponding to a second data line to which a second memory cell is coupled, the second data line being adjacent to the first data line and the third data line; and
   determining a data state of the second memory cell based, at least partially, on the at least one transferred determined data state stored in the data line control unit.

2. The method of claim 1, wherein determining the data state of the second memory cell comprises determining the data state of the second memory cell using the data line control unit.

3. The method of claim 1, including determining the data states of the first memory cell and the third memory cell in response to a request to sense the data state of the second memory cell.

4. The method of claim 1, wherein determining the data state of the second memory cell comprises applying a plurality of sensing voltages to a selected access line to which the second memory cell is coupled to output a number of data states.

5. The method of claim 4, including selecting one of the number of data states based, at least partially, on the transferred determined data.

6. The method of claim 1, further comprising programming the first memory cell, the second memory cell, and the third memory cell in accordance with a shielded data line technique prior to determining the data states of the first, second, and third memory cells.

7. The method of claim 1, wherein operating the memory includes operating the first, second, and the third memory cells as multilevel memory cells (MLCs).

8. The method of claim 1, including selectively coupling the data line control unit to the first data line or the second data line.

9. The method of claim 1, wherein transferring the determined data state of the at least one of the first and the third memory cells to the data line control unit comprises transferring to a dynamic data cache.

10. A method for operating a memory, comprising:
    determining a data state stored by a first memory cell coupled to a first data line and a second memory cell coupled to a third data line;
    transferring the determined data state stored by at least one of the first memory cell and the second memory cell for storage in a first data line control unit selectively coupled to a second data line to which a target memory cell is coupled, wherein the second data line is adjacent to the first data line and the third data line; and
    sensing a data state stored by the target memory cell using a plurality of sensing voltages applied to a selected access line to which the first memory cell, the second memory cell, and the target memory cell are coupled, the sensing voltages based, at least partially, on potential data state combinations of the first and second memory cells.

11. The method of claim 10, including determining the potential data state combinations of the first and second memory cells based on a combination of charges storable on the first and second memory cells.

12. The method of claim 10, including determining the potential data state combinations of the first and second memory cells based on a combination of an erased state and non-erased states for each of the first and second memory cells.

13. The method of claim 10, wherein determining data states stored by the first memory cell coupled to the first data line and the second memory cell coupled to the third data line comprises determining data states stored by the first memory cell and the target memory cell that are selectively coupled to the first data line control unit and the second memory cell that is selectively coupled to a second data line control unit.

14. The method of claim 13, further comprising selectively coupling the first data line control unit and the second data line control unit to a data transfer device.

15. The method of claim 14, further comprising transferring, via the data transfer device, the determined data state stored by the second memory cell from the second data line control unit to the first data line control unit selectively coupled to the first memory cell and the target memory cell.

16. The method of claim 15, further comprising determining a data state of the target memory cell using the first data line control unit.

17. A method for operating a memory, comprising:
    determining a data state of a first memory cell coupled to a first data line in response to a request to sense a data state of a target memory cell coupled to a second data line adjacent the first data line, wherein the first and second data lines are selectively coupled to a first shared data line control unit;
    determining a data state of a second memory cell coupled to a third data line adjacent to the second data line in response to the request to sense the data state of the target memory cell, wherein the third data line is selectively coupled to a second shared data line control unit;
    transferring the determined data state of the second memory cell from the second shared data line control unit to the first shared data line control unit; and
    determining the data state of the target memory cell based, at least partially, on the transferred determined data state of the second memory cell stored in the first shared data line control unit.

18. The method of claim 17, including transferring the determined data state of the second memory cell to the first shared data line control unit via a data transfer device selectively coupled between an interface line of the first shared data line control unit and an interface line of the second shared data line control unit.

19. The method of claim 18, including transferring the determined data state of the second memory cell to the first shared data line control unit responsive to an enable signal provided to the data transfer device.

20. The method of claim 17, wherein determining the data state of the target memory cell is based, at least partially, on the first shared data line control unit using the transferred determined data state of the second memory cell and on the determined data state of the first memory cell.

21. The method of claim 17, wherein determining the data state of the target memory cell comprises applying a plurality of sensing voltages to a selected access line to which the first memory cell, the target memory cell, and the second memory cell are coupled, the plurality of sensing voltages based, at least partially, on potential data state combinations of the first and second memory cells.

22. The method of claim 21, wherein the plurality of sensing voltages correspond to a number of possible data states to which the first and second memory cells are programmable, and wherein the method includes selecting one of a number of output data states based, at least partially, on the determined data states of the first and second memory cells.

23. An apparatus, comprising:
a first data line coupled to a first memory cell and selectively to a first data line control unit;
a second data line coupled to a second memory cell and selectively to the first data line control unit, the second data line adjacent to the first data line;
a third data line coupled to a third memory cell and selectively to a second data line control unit, the third data line adjacent to the second data line; and
control circuitry configured to determine a data state of the second memory cell based, at least partially, on at least one of:
a determined data state of the third memory cell transferred from the second data line control unit for storage in the first data line control unit; and
a determined data state of the first memory cell determined by the first data line control unit.

24. The apparatus of claim 23, wherein the control circuitry is configured to apply a plurality of sensing voltages to a selected access line to which the second memory cell is coupled to output a number of data states.

25. The apparatus of claim 24, wherein the control circuitry is configured to select one of the number of data states based, at least partially, on the determined data states.

26. The apparatus of claim 23, including a first data transfer device selectively coupled between an interface line of the first data line control unit and an interface line of the second data line control unit; and
a second data transfer device selectively coupled between the interface line of the second data line control unit and an interface line of a third data line control unit.

27. The apparatus of claim 23, wherein the first data line control unit is a shared data line control unit, the first and the second data lines being selectively coupled to the shared data line control unit.

28. An apparatus, comprising:
a first data line coupled to a first memory cell and a second data line coupled to a target memory cell, wherein the first and target memory cells are adjacent and share a first data line control unit configured to determine a data state of the first memory cell;

a third data line coupled to a second memory cell, wherein the second memory cell is adjacent to the target memory cell and has a second data line control unit associated therewith to determine a data state of the second memory cell; and
a data transfer device selectively coupled to the first data line control unit and the second data line control unit and configured to enable the apparatus to transfer, via the data transfer device, a determined data state of the second memory cell for storage in the first data line control unit from the second data line control unit.

29. The apparatus of claim 28, wherein the data state of the second memory cell is determined in response to a request to sense the data state of the target memory cell.

30. The apparatus of claim 28, wherein the first data line control unit is configured to determine a data state of the target memory cell based, at least partially, on the determined data state of the first memory cell and the determined data state of the second memory cell.

31. The apparatus of claim 30, wherein the first data line control unit is configured to determine a data state of the target memory cell based, at least partially, on a number of data states output by application of a plurality of sensing voltages to a selected access line to which the target memory cell is coupled.

32. The apparatus of claim 30, wherein an elaboration component of the first data line control unit is configured to determine an appropriate output data state from among a number of output states that result from application of a plurality of different sensing voltages to the target memory cell based, at least partially, on the determined data state of the first memory cell and the determined data state of the second memory cell.

33. The apparatus of claim 28, wherein control circuitry coupled to the first data line control unit is configured to determine a data state of the target memory cell based, at least partially, on the determined data state of the first memory cell and the determined data state of the second memory cell.

34. The apparatus of claim 28, wherein a processor coupled to the first data line control unit is configured to post-process data stored by the first memory cell to determine the data state of the target memory cell based, at least partially, on the determined data state of the first memory cell and the determined data state of the second memory cell.

35. An apparatus, comprising:
a first data line coupled to a first memory cell and a second data line coupled to a target memory cell, wherein the first memory cell is adjacent to the target memory cell;
a third data line coupled to a second memory cell, wherein the second memory cell is adjacent to the target memory cell; and
circuitry configured to:
determine a data state of the first memory cell coupled to a selected access line in response to a request to sense a data state of the target memory cell coupled to the selected access line;
determine a data state of the second memory cell coupled to the selected access line in response to the request to sense the data state of the target memory cell; and
determine a data state of the target memory cell based, at least partially, on at least one of the determined data state of the first memory cell and the determined data state of the second memory cell transferred to a first data line control unit selectively coupled to the target memory cell; and wherein the circuitry includes a data transfer device to transfer, by being selectively coupled to the first data line control unit shared between the first memory cell and the target memory cell, the determined data state of the second memory cell.

36. The apparatus of claim 35, wherein the circuitry is configured to apply a plurality of sensing voltages to the selected access line, the plurality of sensing voltages based, at least partially, on potential data state combinations of the first and second memory cells and wherein the plurality of sensing voltages output a number of data states.

37. The apparatus of claim 35, wherein the data transfer device is selectively coupled between an interface line of the first data line control unit and an interface line of a second data line control unit.

38. The apparatus of claim 37, wherein an enable signal enables the data transfer device to transfer the determined data state of the second memory cell to the first data line control unit.

39. The apparatus of claim 38, wherein the data transfer device comprises a transistor having a first terminal coupled to the interface line of the first data line control unit, a second terminal coupled to the interface line of the second data line control unit, and a gate configured to receive the enable signal.

* * * * *